US006617905B1

(12) United States Patent
An et al.

(10) Patent No.: US 6,617,905 B1
(45) Date of Patent: Sep. 9, 2003

(54) SYSTEM AND METHOD FOR THRESHOLD BIAS OFFSET VOLTAGE CANCELLATION IN A COMPARATOR

(75) Inventors: Hongming An, San Diego, CA (US); Brian Lee Abernethy, Escondido, CA (US); Bruce Harrison Coy, San Diego, CA (US)

(73) Assignee: Applied MicroCircuits Corporation, San Diego, CA (US)

( * ) Notice: Subject to any disclaimer, the term of this patent is extended or adjusted under 35 U.S.C. 154(b) by 0 days.

(21) Appl. No.: 10/282,547

(22) Filed: Oct. 29, 2002

(51) Int. Cl.[7] .................................................. H03L 5/00
(52) U.S. Cl. .......................................... 327/307; 327/66
(58) Field of Search ............................ 327/52, 53, 66, 327/89, 307; 330/9

(56) References Cited

U.S. PATENT DOCUMENTS

| 5,012,244 A | * | 4/1991 | Wellard et al. ............. 341/143 |
| 5,736,885 A | * | 4/1998 | Wietecha et al. ........... 327/307 |
| 6,127,854 A | * | 10/2000 | Illegems ....................... 327/66 |
| 6,201,835 B1 | * | 3/2001 | Wang .......................... 375/247 |
| 6,441,650 B2 | * | 8/2002 | Nikhade ....................... 327/66 |

* cited by examiner

Primary Examiner—My-Trang Nu Ton
(74) Attorney, Agent, or Firm—Law Office of G. Maliszewski; Gerald Maliszewski; Paul Maliszewski

(57) ABSTRACT

A system and method are provided for reducing the threshold bias offset voltage in a comparator, by canceling and bypassing the bias offset current errors. The comparator system comprises amplification stages with bias cancellation circuitry and a threshold setting circuit. The bias offset current cancellation circuit is used to cancel the base current of differential amplifier input emitter follower. The bias offset current cancellation circuit also cancels the loading effect of amplifier input emitter-follower driving stage. The threshold offset voltage is further reduced by the threshold setting circuit. The threshold-setting circuit includes two integrators and a unit gain operation amplifier. The integrators have the input accept a single-ended input signal, an output connected to the negative input of the comparator, and an output connected to the unit gain operational amplifier, whose output is connected to the negative input of the comparator.

33 Claims, 3 Drawing Sheets

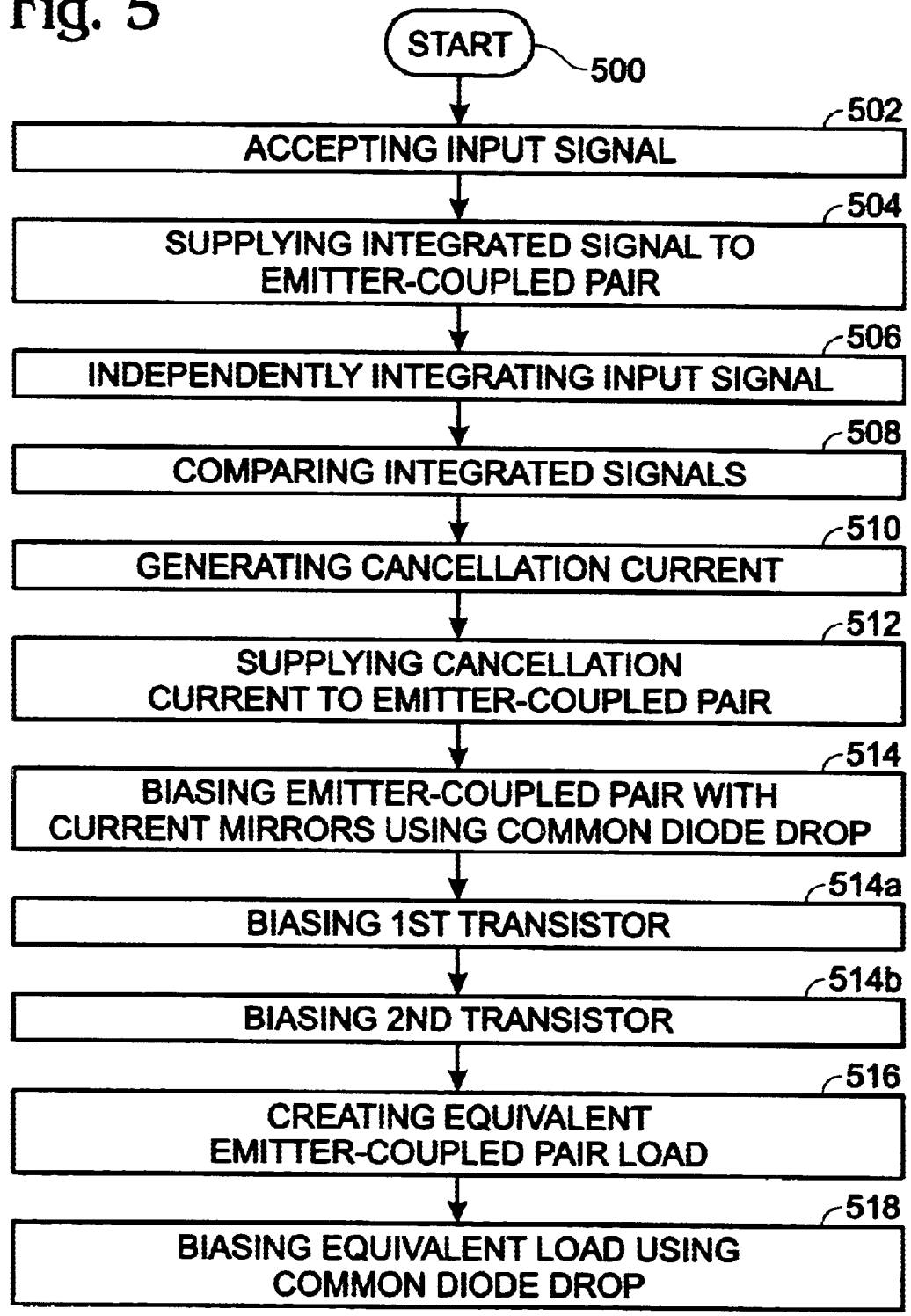

SYSTEM AND METHOD FOR THRESHOLD BIAS OFFSET VOLTAGE CANCELLATION IN A COMPARATOR

BACKGROUND OF THE INVENTION

1. Field of the Invention

This invention generally relates to transistor circuit design and, more particularly, to a transistor circuit design for minimizing threshold offset voltage and bias current errors in a comparator circuit.

2. Description of the Related Art

FIG. 1 is a schematic block diagram of a self-referencing comparator (prior art). A comparator is an important component of a digital signal receiver decision circuit, such as a serial communications optical network, where the input data signal is compared to a preset differential amplifier threshold. In some cases, in order to dynamically track the common mode or dc value of the input signal, an integrator is used for averaging the input signal, to create the comparator threshold. The integrator normally consists of a RC network, as shown in FIG. 1.

One shortcoming of this arrangement is the occurrence of a threshold offset voltage, due to the dc bias current at the comparator input. That is, the flow of current Δi across the resistor creates a voltage drop Δv, and the dc voltage at the positive terminal of the comparator is offset Δv from the dc voltage at the negative terminal. This offset voltage can affect the sensitivity of the comparator and may result in decision circuit bit errors. When this offset voltage is critical, designers can implement additional circuitry to mitigate to effect of the threshold offset voltage. However, while some techniques are able to mitigate for a first order magnitude of the effect. Additional second and third order offset voltage effects may still account for significant decision circuit errors, especially in advanced silicon germanium (SiGe) process devices.

FIG. 2 is a schematic diagram of a differential amplifier circuit, such as may be used in the comparator of FIG. 1 (prior art). The differential amplifier may receive ac signals on the "data out" line (see FIG. 1). In additional, the differential amplifier receives a dc bias current supplied by the dc bias circuitry. The dc bias circuitry typically uses current mirrors to simulate the current flow through the differential amplifier. However, differences between the simulated current flow and the actual current flow through the differential amplifier may result in incorrect dc biasing. Improper dc biasing can also create additional threshold offset voltages that result in decision circuit errors.

It would be advantageous if the threshold offset voltage between the inputs of a comparator could be reduced.

It would be advantageous if differential amplifier dc biasing errors could be reduced.

SUMMARY OF THE INVENTION

The present invention discloses circuitry to reduce dc threshold offset voltage and dc bias current errors in a comparator. In one aspect of the invention, an operational amplifier senses the threshold voltage difference and provides the actual threshold voltage the comparator input, bypassing the offset current of the comparator input stage. In another aspect, the dc bias circuitry associated with a comparator input differential amplifier stage is modified to include a load that more realistically models the actual load of the differential amplifier, so that the current flow through the current mirror more closely resembles the current flow through the differential amplifier.

Accordingly, a system is provided for reducing the threshold bias offset voltage in a comparator, by canceling and bypassing the bias offset current errors. The system comprises a comparator including an emitter-coupled transistor pair including a first and second transistor that operates as the input differential amplifier stage. A first current mirror is connected to bias the first transistor. The system further comprises a third transistor, equivalent to the first transistor. A second current mirror, in parallel with the first current mirror, biases the third transistor.

The first current mirror includes a fourth transistor having an emitter connected to the base of the first transistor and uses a first diode interposed between a first voltage (Vcc) and the base of the fourth transistor. The second current mirror includes a fifth transistor having an emitter connected to the base of the third transistor. The first diode is interposed between the first voltage and the base of the fifth transistor.

A first current source is interposed between the emitters of the first and second transistors, and a second voltage (Vee), lower in potential than the first voltage. A second current source is interposed between the emitter of the third transistor and the second voltage. A third current source is interposed between the emitter of the fourth transistor and the second voltage, and a fourth current source is interposed between the emitter of the fifth transistor and the second voltage.

The above-described bias offset current cancellation circuit cancels the base current of the comparator input stage emitter follower (fourth transistor), and the loading effects of the fourth transistor's driving stage.

The threshold-setting network of the comparator includes two integrators and a unit gain amplifier, formed from an operational amplifier. The first integrator has an input to accept a single-ended input signal, connected to the positive input of the comparator, and the output connected to the negative input of the comparator. A second integrator has an input connected to the input of the first integrator. The operational amplifier has a positive input operatively connected to the output of the second integrator, and an output connected to the operational amplifier negative input, the output of the first integrator, and the negative input of the comparator. The first integrator has a frequency response equal to the frequency response of the second integrator.

Additional details of the above-described differential amplifier biasing circuit and system for the cancellation of threshold offset voltage in a comparator are provided below.

BRIEF DESCRIPTION OF THE DRAWINGS

FIG. 5 is a flowchart illustrating the present invention method for canceling bias current errors in a comparator.

DETAILED DESCRIPTION OF THE PREFERRED EMBODIMENTS

Figure 1:
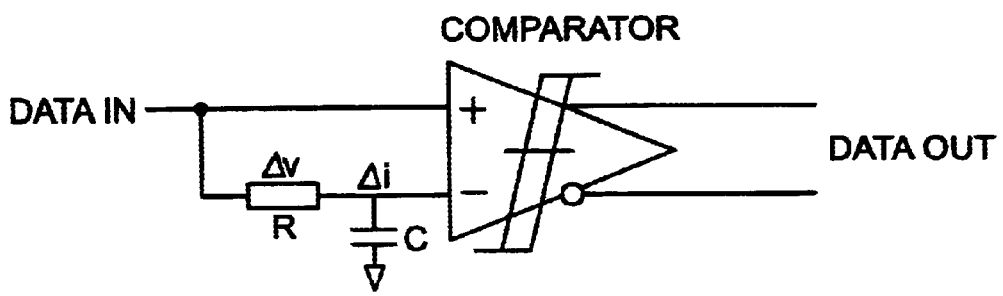
FIG. 1 is a schematic block diagram of a self-referencing comparator (prior art).
Figure 2:
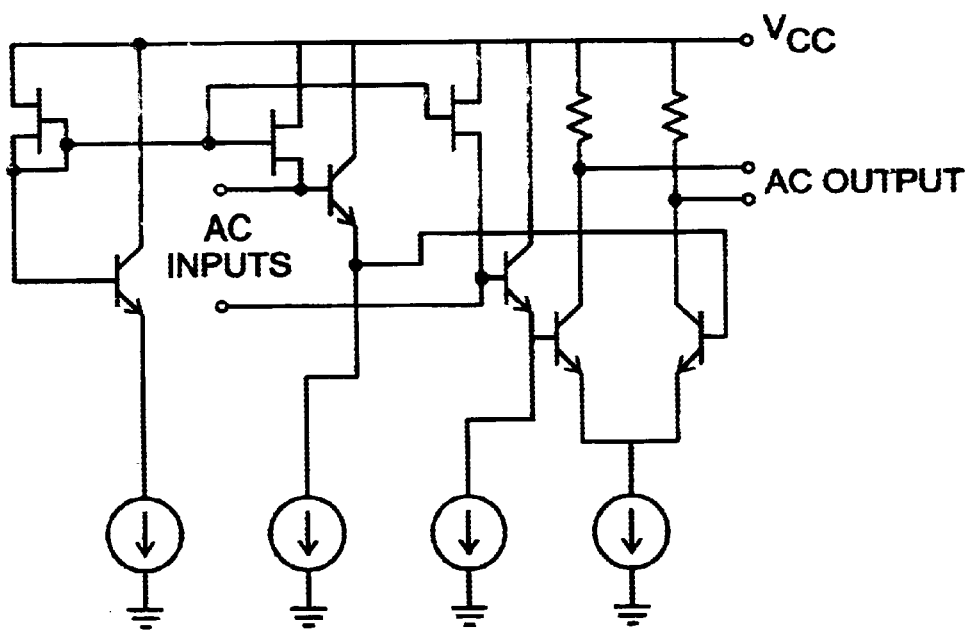
FIG. 2 is a schematic diagram of a differential amplifier circuit, such as may be used in the comparator of FIG. 1 (prior art).
Figure 3:
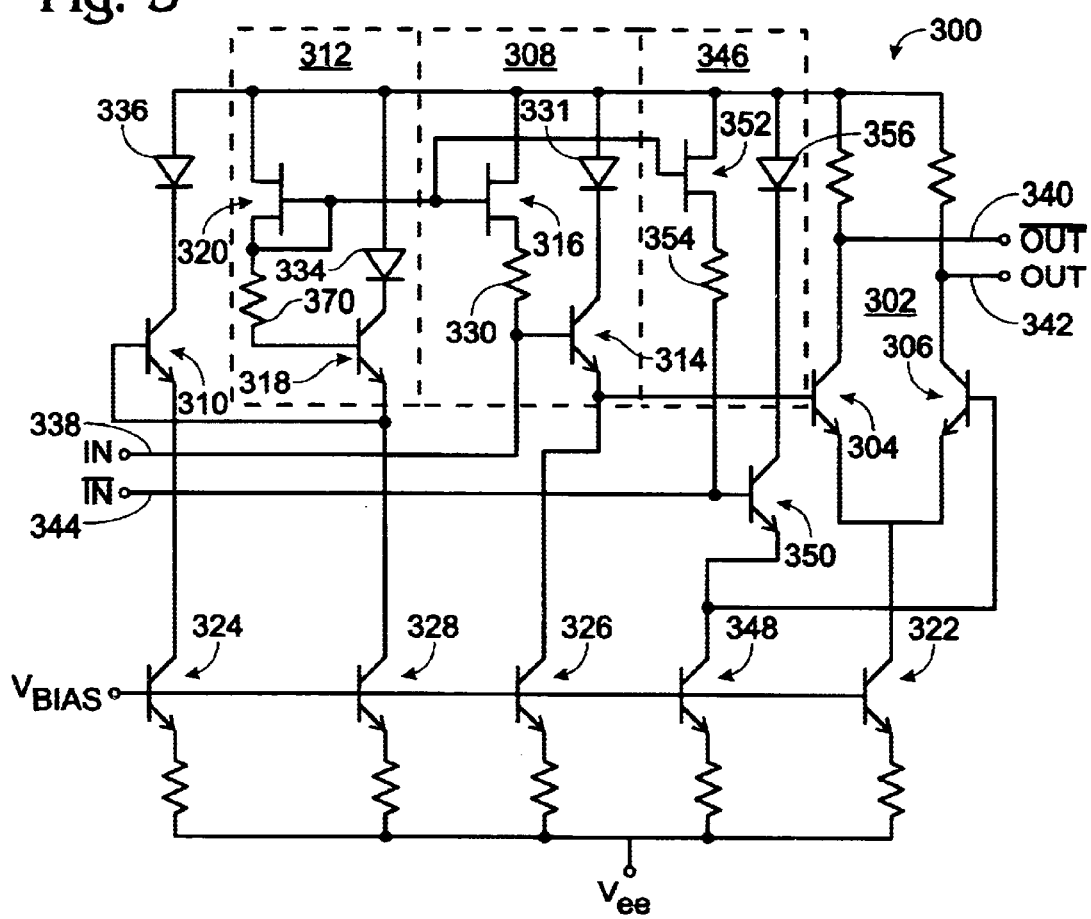
FIG. 3 is a schematic block diagram of the present invention system for canceling bias offset current errors in a comparator.

FIG. 3 is a schematic block diagram of the present invention system for canceling bias offset current errors in a comparator. The canceling of bias current errors minimizes threshold offset voltages. The comparator system 300 has a positive input and negative input, as explained below, and includes an emitter-coupled transistor pair 302 with a first transistor 304 and second transistor 306. A first current mirror 308 is connected to bias the first transistor 304. A third transistor 310, equivalent to the first transistor 304 is shown. A second current mirror 312, in parallel with the first current mirror 308 biases the third transistor 310. As explained below, the designation of comparator positive and negative inputs is arbitrary as the inputs are the same, just complimentary.

The first current mirror 308 includes a fourth transistor 314 having an emitter connected to the base of the first transistor 304 and to the positive input of the comparator system 300. A second field effect transistor (FET) 316 interposed between a first voltage (Vcc) and the base of the fourth transistor 314. The second current mirror 312 includes a fifth transistor 318 having an emitter connected to the base of the third transistor 310. A first diode 320 is interposed between the first voltage and the base of the fifth transistor. The first diode 320 has an anode connected to the first voltage and a cathode operatively connected to the base of the fifth transistor 318. In some aspects of the system, the first diode 320 is a first FET with a drain connected to the first voltage and a source and gate operatively connected to the base of the fifth transistor 318.

The comparator system 300 further includes a first current source 322 interposed between the emitters of the first and second transistors 304/306, and a second voltage (Vee), lower in potential than the first voltage. A second current source 324 is interposed between the emitter of the third transistor 310 and the second voltage. A third current source 326 is interposed between the emitter of the fourth transistor 318 and the second voltage. A fourth current source 328 is interposed between the emitter of the fifth transistor 318 and the second voltage. As shown, the current sources are all bipolar transistors, with each emitter connected in series to the second voltage through a resistor, and with each base connected to a bias voltage (Vbias). However, other current source circuits are well known to those skilled in the art. The present invention is not dependent on any particular type of current source. Note that the current through current source 324 is approximately half of the current sourced through current source 322.

The second FET 316 has a gate connected to the gate of the first FET 320 and a drain connected to the first voltage. In some aspects, the first current mirror 308 further includes a first resistor 330 interposed between the source of the second FET 316 and the base of the fourth transistor 314. A second diode 331 has an anode connected to the first voltage and a cathode connected to the collector of the fourth transistor 314.

The second current mirror 312 would likewise further includes a second resistor 332 interposed between the source of the first FET 320 and the base of the fifth transistor 318. A third diode 334 has an anode connected to the first voltage and a cathode connected to the collector of fifth transistor 318. A fourth diode 336 has an anode connected to the first voltage and a cathode connected to the collector of the third transistor 310. The fourth diode 336 is used for matching the load bias condition.

In some aspects, the emitter-coupled transistor pair 302 accepts a single-ended input signal at the positive input on line 338 and supplies a differential output signal on lines 340 and 342. Alternately, the emitter-coupled transistor pair 302 accepts a differential input signal at the positive and negative inputs on lines 338 and 344, respectively.

The comparator system 300 further includes a third current mirror 346 connected, in parallel with the first current mirror 308, to bias the second transistor 306. That is, the third current mirror 346 relies upon the voltage drop across the first diode 320. Then, a fifth current source 348 is connected between third current mirror 346 and the second voltage.

The third current mirror 346 includes a sixth transistor 350 having an emitter connected to the base of the second transistor 306 and a base connected to the comparator negative input on line 344. A third FET 352 has a gate connected to the gate of the first FET 320 and a drain connected to the first voltage. A third resistor 354 is interposed between the source of the third FET 352 and the base of the sixth transistor 350. A fifth diode 356 has an anode connected to the first voltage and a cathode connected to the collector of the sixth transistor 350.

Note that the second, third, fourth, and fifth diodes can be bipolar transistors with the bases tied to their respect collectors in some aspects of the invention. As shown, the first, second, third, fourth, fifth, and sixth transistors are n-p-n transistors. However, in other aspects of the invention, some or all of the n-p-n transistors can be replaced with p-n-p transistors or even FET transistors with minor circuit modifications.

Note that resistors 330, 354, and 380 are influential in the frequency performance of the differential amplifier circuit. Typically, transistors 318, 314, and 350 are identical or designed to provide approximately identical performance. Likewise, transistors 328, 326, and 348 are identical or designed to provide approximately identical performance. Transistors 310 and 304 are identical or designed to provide identical performance.

Figure 4:
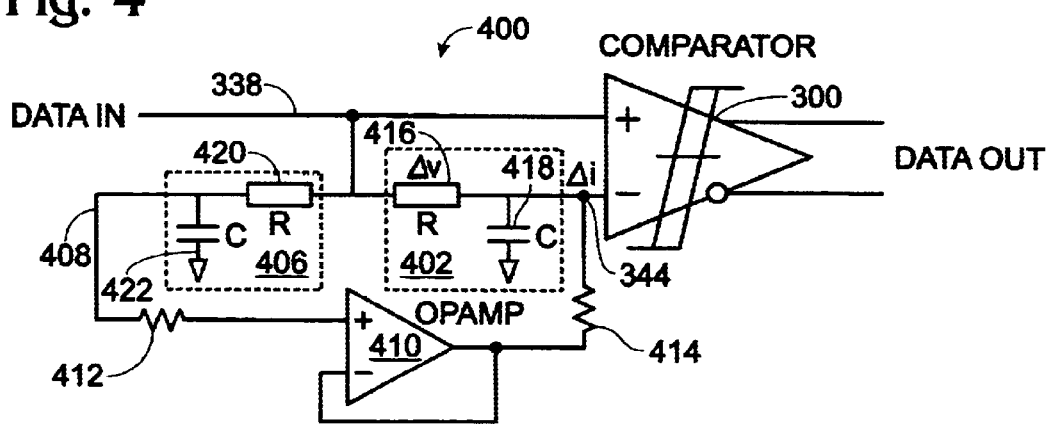
FIG. 4 is a schematic block diagram illustrating the present invention threshold setting circuit.

FIG. 4 is a schematic block diagram illustrating the present invention threshold setting circuit 400. The threshold setting circuit 400 includes a first integrator 402 having an input to accept a single-ended input signal on line 338, connected to the positive input of the comparator 300 (see FIG. 3), and an output connected to the negative input of the comparator on line 344. A second integrator 406 has an input connected to the input of the first integrator on line 338 and an output on line 408. An operational amplifier 410 has a positive input operatively connected to the output of the second integrator on line 408, and an output connected to the operational amplifier negative input, the output of the first integrator, and the negative input of the comparator 300. As used herein, the term operatively connected is defined as either directly connecting or indirectly connecting through another element.

In some aspects, a seventh resistor 412 is interposed between the output of the second integrator 406 and the positive input of the operational amplifier 410. A fourth resistor 414, equal in value to the seventh resistor 412, is interposed between the output of the operational amplifier 410 and the output of the first integrator on line 344. The value of the seventh resistor 412 equals the value of the fourth resistor 414.

The first integrator 402 has a frequency response equal to the frequency response of the second integrator 406. As shown, the first and second integrators 402/406 are simple RC networks. However, in other aspects of the invention alternate integrators may be used. It should be noted that some or all the resistance and capacitance in the RC networks may represent transmission line parasitic effects in the layout of the circuit or the connection of the circuit to interfacing circuits.

As shown, the first integrator 402 includes a fifth resistor 416 (R5) in series between the input of the first integrator on line 338 and the base of the negative input of the comparator 300 on line 344. A first capacitor (C1) 418 is in shunt between the fifth resistor 416 and the base of the sixth transistor on line 344. The first integrator 402 has a frequency response (T1) of:

$$T1=1/(1+j\omega R5C1).$$

The second integrator 406 includes a sixth resistor (R6) 420, equal in value to the fifth resistor 416, in series between the input of the second integrator 406 on line 338 and the output of the second integrator 406 on line 408. A second capacitor (C2) 422, equal in value to the first capacitor 418, is in shunt between the sixth resistor 420 and the positive input of the operational amplifier 410. As shown, the second capacitor 422 is in shunt between the sixth resistor 420 and the third resistor 412. The second integrator 406 has a frequency response (T2) of:

$$T2=T1=1/(1+j\omega R6C2).$$

The operational amplifier 410 has a frequency response (Top) of:

$$Top>10/(1+j\omega R6C2).$$

Therefore, the threshold setting circuit 400 has a frequency response (Tcomp) of:

$$Tcomp=Top/(1+j\omega R6C2).$$

Functional Description

This present invention design provides second order offset current compensation (FIG. 3) and third order compensation (FIG. 4) for reducing the threshold bias current and, therefore threshold bias offset voltages. The circuitry also provides enhanced temperature tracking capability, to enable accurate control and adjustment for the dispersion compensation threshold of a high-speed optical link receiver.

The comparator circuitry has two parts: amplification stages and a threshold setting circuit. The amplification stages may use a combination of a Cherry-Couper stage and a differential stage to provide the required wideband and high gain, as well as high swing for the next stage of signal processing. The input stage also provides a wide common mode range for input signals generated by the linear front-end amplifier.

The threshold-setting network has two integrators and a unit gain amplifier, formed from an operation amplifier to provide a threshold reference from the incoming signals. This network also provides the capability of using external control to adjust the threshold, and it can also track the data dc average changes in response to environment variations.

As the comparator is very sensitive to the input signals, the reference threshold must be precisely controlled. That is, the offset current in the input stages of the comparator needs to be cancelled so that the threshold offset voltage is minimized. This is achieved in two ways:

1) The DC bias circuitry associated with the input differential amplifier stage of the comparator uses a second order offset cancellation circuit to cancel the base current of input emitter follower. A load that more realistically responds as the actual load of the differential amplifier is used, so that the current flow through the current mirror more closely resembles the current flow through the differential amplifier; and, 2) The threshold setting circuit senses the true threshold voltage and provides it to the input of the comparator, virtually bypassing the bias offset current of the comparator input stage.

FIG. 5 is a flowchart illustrating the present invention method for canceling bias current errors in a comparator. The cancelled current errors result in minimal threshold offset voltages. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 accepts an input signal. Step 504 supplies an integrated input signal to the negative input of a comparator using a first integrator. Step 506 independently integrates the input signal using a second integrator. Step 508 compares the integrated input signals. Step 510 generates bias cancellation current in response to the comparison. Step 512 supplies the cancellation current to the negative input of the comparator. Step 514 biases a comparator emitter-coupled transistor pair with current mirrors having a common diode drop. Step 516 creates a load equivalent to the emitter-coupled transistor pair. Step 518 biases the equivalent load using the common diode drop.

In some aspects of the method, biasing an emitter-coupled transistor pair with current mirrors having a common diode drop in Step 514 includes substeps. Step 514a generates bias current for a first transistor of the emitter-coupled transistor pair using a first current mirror with a first diode. Step 514b generates bias current for a second transistor of the emitter-coupled transistor pair using a third current mirror with the first diode. In other aspects, biasing the equivalent load using the common diode drop in Step 518 includes generating bias current using a second current mirror with the first diode.

In some aspects, creating a load equivalent to the emitter-coupled transistor pair in Step 516 includes conducting current through a third transistor, equivalent to the first and second transistors.

In other aspects, comparing the integrated input signals in Step 508 includes connecting the two integrated input signals to the inputs of a unity gain amplifier. Then, supplying the cancellation current to the negative input of the comparator in Step 512 includes connecting the output of the unity gain amplifier to the negative input of the comparator.

A system and method have been presented for reducing the errors associated with dc biasing and threshold offset voltage in a comparator using a differential amplifier. Specific circuit examples have been provided to illustrate the features of the invention. However, the present invention is not limited to merely these examples. Other variations and embodiments of the invention will occur to those skilled in the art.

We claim:

1. A system for canceling bias offset current errors, to minimize threshold offset voltages in a comparator, the system comprising:

a comparator with a positive input and a negative input, including:

an emitter-coupled transistor pair including a first and second transistor;

a first current mirror connected to bias the first transistor;

a third transistor, equivalent to the first transistor; and, a second current mirror, in parallel with the first current mirror, to bias the third transistor.

2. The system of claim 1 wherein the first current mirror includes:

a fourth transistor having an emitter connected to the base of the first transistor and a base connected to the positive input of the comparator;

a first diode interposed between the base of the fourth transistor and a first voltage (Vcc); and, wherein the second current mirror includes:

a fifth transistor having an emitter connected to the base of the third transistor; and, a first device selected from the group including a diode and an FET interposed between the first voltage and the base of the fifth transistor.

3. The system of claim 2 wherein the comparator further includes:

a first current source interposed between the emitters of the first and second transistors, and a second voltage (Vee), lower in potential than the first voltage;

a second current source interposed between the emitter of the third transistor and the second voltage;

a third current source interposed between the emitter of the fourth transistor and the second voltage; and, a fourth current source interposed between the emitter of the fifth transistor and the second voltage.

4. The system of claim 3 wherein the first device of the second current mirror is a diode with an anode connected to the first voltage and a cathode operatively connected to the base of the fifth transistor.

5. The system of claim 3 wherein the first device of the second current mirror is a first FET with a drain connected to the first voltage and a source and gate operatively connected to the base of the fifth transistor.

6. The system of claim 5 wherein the first current mirror further includes:

a second FET with a gate connected to the gate of the first FET and a drain connected to the first voltage;

a first resistor interposed between the source of the second FET and the base of the fourth transistor;

a second diode having an anode connected to the first voltage and a cathode connected to the collector of the fourth transistor; and, wherein the second current mirror further includes:

a second resistor interposed between the source of the first FET and the base of the fifth transistor;

a third diode with an anode connected to the first voltage and a cathode connected to the collector of fifth transistor; and, a fourth diode with an anode connected to the first voltage and a cathode connected to the collector of the third transistor.

7. The system of claim 6 wherein the comparator accepts a single-ended input signal at the positive input and supplies a differential output signal.

8. The system of claim 7 wherein the comparator further includes:

a third current mirror connected, in parallel with the first current mirror, to bias the second transistor.

9. The system of claim 8 wherein the third current mirror includes:

a sixth transistor having an emitter connected to the base of the second transistor and a base connected to the negative input of the comparator;

a third FET having a gate connected to the gate of the first FET and a drain connected to the first voltage;

a third resistor interposed between the source of the third FET and the base of the sixth transistor; and, a fifth diode having an anode connected to the first voltage and a cathode connected to the collector of the sixth transistor.

10. The system of claim 9 wherein the comparator further includes:

a fifth current source interposed between the emitter of the sixth transistor and the second voltage.

11. The system of claim 9 wherein the first, second, third, fourth, fifth, and sixth transistors are n-p-n transistors.

12. The system of claim 1 further comprising:

a threshold setting circuit including:

a first integrator having an input to accept a single-ended input signal and an output connected to the negative input of the comparator;

a second integrator having an input connected to the input of the first integrator and an output;

an operational amplifier having a positive input operatively connected to the output of the second integrator, and an output connected to the operational amplifier negative input and the output of the first integrator.

13. The system of claim 12 wherein the input of the first integrator is connected to the positive input of the comparator.

14. The system of claim 13 wherein the threshold setting circuit further includes:

a seventh resistor interposed between the output of the second integrator and the positive input of the operational amplifier; and a fourth resistor, equal in value to the seventh resistor, interposed between the output of the operational amplifier and the output of the first integrator.

15. The system of claim 13 wherein the first integrator has a frequency response equal to the frequency response of the second integrator.

16. The system of claim 15 wherein the first integrator includes:

a fifth resistor (R5) in series between the input of the first integrator and the base of the sixth transistor;

a first capacitor (C1) in shunt between the fifth resistor and the base of the sixth transistor; and, a first integrator frequency response (T1) of:

$T1=1/(1+j\omega R5C1)$; and, wherein the second integrator includes:

a sixth resistor (R6), equal in value to the fifth resistor, in series between the input of the second integrator and the output of the second integrator;

a second capacitor (C2), equal in value to the first capacitor, in shunt between the sixth resistor and the positive input of the operational amplifier;

a second integrator frequency response (T2) of:

$T2=T1=1/(1+j\omega R6C2)$.

17. The system of claim 16 wherein the operational amplifier has a frequency response (Top) of:

$Top>10/(1+j\omega R6C2)$; and, wherein the threshold setting circuit has a frequency response (Tcomp) of:

$Tcomp=Top/(1+j\omega R6C2)$.

18. In a comparator, a system for the cancellation of threshold offset voltages, the system comprising:
 a comparator having positive and negative inputs; and,
 a threshold setting circuit including:
  a first integrator having an input to accept an input signal and an output connected to the negative input of the differential amplifier;
  a second integrator having an input connected to the input of the first integrator and an output; and,
  an operational amplifier having a positive input connected to the output of the second integrator, and an output connected to the operational amplifier negative input and to the output of the first integrator.

19. The system of claim 18 wherein the input of the first integrator is connected to the positive input of the differential amplifier.

20. The system of claim 19 wherein the threshold setting circuit further includes:
 a first resistor interposed between the output of the second integrator and the positive input of the operational amplifier; and
 a second resistor, equal in value to the first resistor, interposed between the output of the operational amplifier and the output of the first integrator.

21. The system of claim 19 wherein the first integrator has a frequency response; and,
 wherein the second integrator has a frequency response equal to the frequency response of the first integrator.

22. The system of claim 21 wherein the first integrator includes:
 a fifth resistor (R5) in series between the input of the first integrator and the negative input of the differential amplifier;
 a first capacitor (C1) in shunt between the fifth resistor and the negative input of the differential amplifier; and,
 wherein the first integrator frequency response (T1) is:

$T1=1/(1+j\omega R5C1)$; and, wherein the second integrator includes:
 a sixth resistor (R6), with a value equal to the fifth resistor, in series between the input of the second integrator and the positive input of the operational amplifier;
 a second capacitor (C2), with a value equal to the first capacitor, in shunt between the sixth resistor and the positive input of the operational amplifier; and,
 wherein the second integrator frequency response (T2) is:

$T2=T1=1/(1+j\omega R6C2)$.

23. The system of claim 22 wherein the operational amplifier has a frequency response (Top) of:

$Top>10/(1+j\omega R6C2)$; and, wherein the threshold setting circuit has a frequency response (Tcomp) of:

$Tcomp=Top/(1+j\omega R6C2)$.

24. The system of claim 18 wherein the comparator includes:

a first current mirror:
a second current mirror:
a third current mirror;
an emitter-coupled transistor pair including a first transistor with a base operatively connected to the output of the first integrator through the first current mirror and second transistor with a base operatively connected to the input of the first integrator though the third current mirror;
wherein the a first current mirror is connected to bias the first transistor;
a third transistor, equivalent to the first transistor; and,
wherein the a second current mirror, is in parallel with the first current mirror, to bias the third transistor.

25. The system of claim 24 wherein the first current mirror includes:
 a fourth transistor having an emitter connected to the base of the first transistor and a base connected to the input of the first integrator; and,
 a second field effect transistor (FET) interposed between a first voltage (Vcc) and the base of the fourth transistor; and,
wherein the second current mirror includes:
 a fifth transistor having an emitter connected to the base of the third transistor; and,
 a first diode interposed between the first voltage and the base of the fifth transistor.

26. The system of claim 25 wherein the comparator further includes:
 a first current source interposed between the emitters of the first and second transistors, and a second voltage (Vee), lower in potential than the first voltage;
 a second current source interposed between the emitter of the third transistor and the second voltage;
 a third current source interposed between the emitter of the fourth transistor and the second voltage; and,
 a fourth current source interposed between the emitter of the fifth transistor and the second voltage.

27. The system of claim 26 wherein the third current mirror is connected, in parallel with the first current mirror, to bias the second transistor.

28. A method for canceling bias current errors in a comparator, the method comprising:
 biasing a comparator emitter-coupled transistor pair with current mirrors having a common diode drop;
 creating a load equivalent to the emitter-coupled transistor pair; and,
 using the common diode drop, biasing the equivalent load.

29. The method of claim 28 wherein biasing an emitter-coupled transistor pair with current mirrors having a common diode drop includes:
 generating bias current for a first transistor of the emitter-coupled transistor pair using a first current mirror with a first diode;
 generating bias current for a second transistor of the emitter-coupled transistor pair using a third current mirror with the first diode.

30. The method of claim 29 wherein biasing the equivalent load using the common diode drop includes generating bias current using a second current mirror with the first diode.

31. The method of claim 30 wherein creating a load equivalent to the emitter-coupled transistor pair includes conducting current through a third transistor, equivalent to the first and second transistors.

32. The method of claim 31 further comprising:

accepting an input signal;

using a first integrator, supplying an integrated input signal to a negative input of the comparator;

using a second integrator, independently integrating the input signal;

comparing the integrated input signals;

in response to the comparison, generating bias cancellation current; and, supplying the cancellation current to the negative input of the comparator.

33. The method of claim 32 wherein comparing the integrated input signals includes connecting the two integrated input signals to the inputs of a unity gain amplifier; and, wherein supplying the cancellation current to the negative input of the comparator includes connecting the output of the unity gain amplifier to the negative input of the comparator.

* * * * *